(12) United States Patent
Lehr et al.

(10) Patent No.: US 8,828,888 B2
(45) Date of Patent: Sep. 9, 2014

(54) PROTECTION OF REACTIVE METAL SURFACES OF SEMICONDUCTOR DEVICES DURING SHIPPING BY PROVIDING AN ADDITIONAL PROTECTION LAYER

(75) Inventors: Matthias Lehr, Dresden (DE); Joerg Hohage, Dresden (DE); Andreas Ott, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 210 days.

(21) Appl. No.: 13/421,154

(22) Filed: Mar. 15, 2012

(65) Prior Publication Data

US 2012/0235285 A1 Sep. 20, 2012

(30) Foreign Application Priority Data

Mar. 16, 2011 (DE) .......................... 10 2011 005 642

(51) Int. Cl.
*H01L 21/02* (2006.01)
*H01L 23/00* (2006.01)
*H01L 23/31* (2006.01)

(52) U.S. Cl.
CPC ....... *H01L 24/05* (2013.01); *H01L 2924/01013* (2013.01); *H01L 2224/85205* (2013.01); *H01L 2924/01327* (2013.01); *H01L 2924/01019* (2013.01); *H01L 2224/05647* (2013.01); *H01L 24/85* (2013.01); *H01L 2224/45147* (2013.01); *H01L 2924/01029* (2013.01); *H01L 2924/014* (2013.01); *H01L 2924/01073* (2013.01); *H01L 2924/01082* (2013.01); *H01L 24/03* (2013.01); *H01L 2924/01068* (2013.01); *H01L 2924/01047* (2013.01); *H01L 2224/45124* (2013.01); *H01L 24/45* (2013.01); *H01L 2924/01033* (2013.01); *H01L 2924/01072* (2013.01); *H01L 2224/45144* (2013.01); *H01L 2224/48747* (2013.01); *H01L 2924/01079* (2013.01); *H01L 2924/01014* (2013.01); *H01L 2224/48847* (2013.01); *H01L 2924/01074* (2013.01); *H01L 2224/85375* (2013.01); *H01L 2224/48647* (2013.01); *H01L 23/3107* (2013.01); *H01L 23/3171* (2013.01); *H01L 2924/01006* (2013.01); *H01L 2924/01075* (2013.01); *H01L 2924/01015* (2013.01)
USPC .......................................................... 438/787

(58) Field of Classification Search
CPC ....................................................... H01L 24/03
USPC .................................. 257/632; 438/106, 787
See application file for complete search history.

(56) References Cited

U.S. PATENT DOCUMENTS

| 6,667,230 B2 | 12/2003 | Chen et al. | |
|---|---|---|---|
| 2002/0000665 A1 | 1/2002 | Barr et al. | |
| 2002/0142592 A1 | 10/2002 | Barth et al. | |
| 2004/0175932 A1* | 9/2004 | Kim et al. | 438/637 |
| 2008/0099913 A1* | 5/2008 | Lehr et al. | 257/737 |

(Continued)

OTHER PUBLICATIONS

Translation of Official Communication from German Patent Application No. 10 2011 005 642.4 dated Nov. 11, 2011.

*Primary Examiner* — Daniel Shook
(74) *Attorney, Agent, or Firm* — Amerson Law Firm, PLLC

(57) ABSTRACT

When forming complex metallization systems on the basis of copper, the very last metallization layer may receive contact regions on the basis of copper, the surface of which may be passivated on the basis of a dedicated protection layer, which may thus allow the patterning of the passivation layer stack prior to shipping the device to a remote manufacturing site. Hence, the protected contact surface may be efficiently re-exposed in the remote manufacturing site on the basis of an efficient non-masked wet chemical etch process.

6 Claims, 5 Drawing Sheets

(56) References Cited

U.S. PATENT DOCUMENTS

2009/0115074 A1  5/2009  Hammer et al.
2009/0166861 A1* 7/2009  Lehr et al. .................... 257/737
2009/0243105 A1  10/2009 Lehr et al.

* cited by examiner

PROTECTION OF REACTIVE METAL SURFACES OF SEMICONDUCTOR DEVICES DURING SHIPPING BY PROVIDING AN ADDITIONAL PROTECTION LAYER

BACKGROUND OF THE INVENTION

1. Field of the Invention

The present disclosure generally relates to the field of integrated circuits, and, more particularly, to a back end of line processing for providing highly conductive contact pads based on copper and the like in sophisticated metallization structures.

2. Description of the Related Art

The manufacturing of integrated circuits involves many complex process steps to form circuit elements, such as transistors, capacitors, resistors and the like, in and above an appropriate semiconductor material. In recent years, enormous advances have been made in increasing integration density and overall functionality of the integrated circuits. These advances have been achieved by scaling the individual circuit elements to dimensions in the deep sub-micrometer range, with currently used critical dimensions, such as the gate length of a field effect transistor, of 30 nm and less. Hence, millions of circuit elements may be provided in a die region, wherein a complex interconnect fabric may have to be designed, in which typically each circuit element may be electrically connected to one or more other circuit elements. These interconnect structures are typically established in a metallization system comprising one or more wiring levels, in which appropriate metal features are formed according to the circuit configuration under consideration in a similar manner as a multi-level printed circuit board, wherein, however, the dimensions of the metal features have to be adapted to the dimensions of the semiconductor circuit elements, such as the transistors, and the like.

Over many decades, aluminum has been used as the metal of choice for forming the metal features in the metallization layers of the semiconductor devices due to its moderately high thermal and electrical conductivity, its self-limiting creation of a passivating oxide layer and its compatibility with other materials and process techniques used for fabricating integrated devices. With the continuous reduction of the circuit dimensions, the dimensions of the metal features have resulted in a situation in which the overall signal delay in the devices is no longer restricted by the performance of the individual semiconductor circuit elements, such as the switching speed of the transistors, but is substantially determined by the parasitic time constants in the metallization system caused by the restricted conductivity of aluminum and the parasitic capacitance between neighboring metal regions. Therefore, in modern integrated circuits, highly conductive metals, such as copper and alloys thereof, are used to accommodate the high current densities encountered during the operation of the devices, while the parasitic capacitance may be reduced by using low-k dielectric materials, which are to be understood as dielectrics having a dielectric constant of 3.0 or less.

In an advanced stage of the manufacturing of integrated circuits, it is usually necessary to package a chip and provide leads and terminals for connecting the chip circuitry with the periphery. In some packaging techniques, chips, chip packages or other appropriate units may be connected by means of solder balls, formed from so-called solder bumps, that are formed on a corresponding layer of at least one of the units, for instance on a dielectric passivation layer of the microelectronic chip. In order to connect the microelectronic chip with the corresponding carrier, the surfaces of two respective units to be connected, i.e., the microelectronic chip comprising, for instance, a plurality of circuits, and a corresponding package, have formed thereon adequate pad arrangements to electrically connect the two units after reflowing the solder bumps provided at least on one of the units, for instance, on the microelectronic chip. In other techniques, solder bumps may have to be formed that are to be connected to corresponding wires, or the solder bumps may be brought into contact with corresponding pad areas of another substrate acting as a heat sink. Consequently, it may be necessary to form a large number of solder bumps that may be distributed over the entire chip area, thereby providing, for example, the I/O (input/output) capability, as well as the desired low-capacitance arrangement required for high frequency applications of modern microelectronic chips that usually include complex circuitry, such as microprocessors, storage circuits and the like, and/or include a plurality of integrated circuits forming a complete complex circuit system.

Another approach for connecting chips with a package includes wire bonding techniques, which have been successfully developed over many decades on the basis of aluminum and are still well established and represent the dominant technology for connecting the fast majority of semiconductor chips to a carrier substrate, wherein usually aluminum-based bond pads are provided, which are contacted by an appropriate wire made of aluminum, copper, gold and the like. During the wire bonding process, the bond wire is then at one end brought into contact with the bond pad. Upon applying pressure, elevated temperature and ultrasonic energy, the wire, which may have formed thereon a ball, if required, is welded to the bond pad so as to form an intermetallic connection. Thereafter, the other end of the bond wire may be bonded to a lead pin of the package, in which the semiconductor chip is mechanically fixed during the bond process.

However, many advanced semiconductor devices may have a copper-based metallization structure in view of device performance, integration density and process compatibility in facilities fabricating a wide variety of different products, wherein, however, the connection to the carrier substrate or the package is to be established by wire bonding due to less demanding I/O capabilities as compared to, for instance, CPUs and other highly complex ICs, and the economic advantages of the wire bonding techniques over complex bump-based techniques. For example, sophisticated memory devices may require very complex high performance metallization systems, while the I/O capacity may be readily achieved on the basis of wire bonding. In a production environment, however, the wire bonding on copper bond pads is very difficult to achieve due to an inhomogeneous self-oxidization of the copper surface in combination with extensive corrosion, which may result in highly non-reliable bond connections. That is, the bond pads and the bond wires connected thereto may suffer from pronounced corrosion, in particular when exposed to sophisticated environmental conditions, as may occur during normal operation and in particular during test periods performed at elevated temperatures.

Many types of advanced semiconductor devices, however, may have a copper-based metallization structure in view of device performance, integration density and process compatibility in semiconductor facilities that fabricate a wide variety of different products, wherein, however, the connection to the carrier substrate or the package is to be established by wire bonding due to less demanding I/O capabilities as compared to, for instance, CPUs and other highly complex integrated circuits, and due to the economic advantages of the wire bonding techniques over complex bump based techniques.

For example, sophisticated memory devices may require very complex high performance metallization systems while the I/O capacity may be readily achieved on the basis of wire bonding. In a production environment, the wire bonding on copper bond pads may require non-corroded surface areas in order to allow a reliable inter-metallic connection between the bond wire and the copper-containing contact surface.

Irrespective of whether complex bump structures of wire bonding techniques are to be applied for connecting the semiconductor chip with an appropriate carrier material or package, typically different manufacturing environments are involved in forming the complex metallization system on the one hand and performing final manufacturing steps including the dicing and packaging of the semiconductor chips on the other hand. A corresponding splitting of the manufacturing process, as is well established in current semiconductor fabrication infrastructures, may involve additional problems with respect to complex copper-based metallization systems, as will be described in more detail with reference to FIGS. 1a-1d.

FIG. 1a schematically illustrates a cross-sectional view of a semiconductor device 100 in a very advanced manufacturing stage. The device 100 comprises a substrate 101, such as a silicon material, or any other appropriate carrier material for forming thereon a semiconductor layer 102, in and above which circuit elements 103 are formed. For example, the circuit elements 103 may include transistors, capacitors, resistors and the like, as required for implementing the desired circuit function. Furthermore, a metallization system 150 is formed above the circuit elements 103 and typically comprises a plurality of metallization layers 151, 152, 153, 154, each of which comprises at least corresponding metal lines so as to provide inner-level electrical connections, while vertical contacts or vias are provided so as to electrically connect one metallization layer with a neighboring metallization layer. For example, the metallization layer 151 comprises an appropriate dielectric material 151A which may include sophisticated low-k dielectric materials in which are embedded metal lines or regions 151B, which are typically formed on the basis of copper material, as discussed above. Similarly, the metallization layer 152 may comprise a dielectric material 152A in combination with metal features 152B, wherein a cap layer 152C may be provided so as to reliably cover any metal features of the metallization layer 151 and also to act as an etch stop material upon patterning the dielectric material 152A. For example, typical materials used for a cap layer are silicon nitride, nitrogen-enriched silicon carbide and the like. Similarly, the metallization layer 153 may comprise a dielectric material 153A and corresponding metal features 153B followed by a cap layer 154C. The metallization layer 154 represents the final or very last metallization layer of the system 150 and comprises an appropriate dielectric material 154A in combination with metal regions 154B, which are also considered as contact regions in order to receive appropriate bump elements or to receive a bond wire in a later manufacturing stage. As discussed above, the metal regions 154B may comprise a copper material and may thus have a copper-containing surface 154S, which is also referred to as a contact surface. Moreover, a cap layer 155C is formed on the metallization layer 154 in order to appropriately confine the metal features 154B and enable appropriate patterning processes to be performed on a passivation layer stack 160, which may comprise a plurality of different material layers, such as layers 161, 162 and the like. Typically, the passivation layer stack 160 may comprise materials such as silicon dioxide, silicon oxynitride, silicon nitride and the like.

The semiconductor device 100 as shown in FIG. 1a is formed on the basis of any appropriate process strategy, wherein the substrate 101 is processed on wafer bases, that is, a plurality of semiconductor die regions are provided in or on the substrate 101 in order to form a plurality of substantially identical semiconductor devices. To this end, typically a semiconductor facility comprises a plurality of process modules, such as lithography modules, etch modules, anneal modules, implantation modules and the like, in which the substrates 101 are processed in accordance with dedicated process recipes in compliance with the requirements of the semiconductor device 100. Hence, after completing the semiconductor-based circuit elements 103, the metallization system 150 is formed by using sophisticated process techniques which may typically include the deposition of an appropriate dielectric material and patterning the same so as to form respective openings therein, which are subsequently filled with a copper-based material in combination with appropriate barrier materials (not shown), followed by the removal of any excess material. Hence, layer after layer, the plurality of metallization layers 151, 152, 153, 154 are formed by applying basically the same process strategy, wherein, however, the corresponding critical dimensions may have to be adapted to the metallization layer under consideration. Finally, the very last metallization layer 154 is formed so as to include the contact regions 154B so as to be appropriately positioned and having an appropriate lateral size in compliance with the further processing, i.e., with forming solder bumps or providing bond areas for a wire bond process. After forming the cap layer 155C, the layer stack 160 is deposited on the basis of well-established process techniques, wherein typically a further patterning process may be applied on the basis of lithography techniques and plasma-based etch recipes.

FIG. 1b schematically illustrates the device 100 in a further advanced manufacturing stage. As shown, openings 160A are formed in the passivation layer stack 160 and may also extend through the cap layer 155C, thereby exposing a portion of the surface 154S. To this end, any appropriate plasma-based etch recipes may be applied in combination with lithography techniques. As shown, the processing up to this manufacturing stage may be performed on the basis of the substrate 101 comprising a plurality of die regions 110. Frequently, the further processing may be continued in a remote manufacturing facility in which dedicated process equipment and manufacturing strategies are implemented so as to finalize the device 100, which typically includes the formation of an appropriate bump structure or performing wire bonding processes after dicing the substrate into individual semiconductor chips. Consequently, as indicated by 140, the substrate 101 may be transported to a different manufacturing environment which, however, may result in a certain degree of surface contamination, for instance by oxidation and the like, by forming a highly irregular surface which may result in corresponding yield losses upon forming an appropriate bump structure or performing a wire bond process on the basis of the surface 154S contaminated during the transport 140.

Consequently, it has been suggested to transport the devices 100 prior to actually patterning the passivation layer stack 160, which, however, may require significant additional resources in the remote manufacturing facility since lithography processes in combination with plasma-based etch processes have to be carried out. In other approaches, the contact regions 154B may receive a terminal metal layer (not shown), for instance comprised of aluminum, which has been a well-established material for forming thereon bump structures or performing a wire bond process. In this case, however, significant additional resources have to be provided in the manufacturing environment in which the metallization system 150 is fabricated.

FIG. 1d schematically illustrates a cross-sectional view of the device 100 in a further advanced manufacturing stage in which a further passivation layer 170, such as a polyamide layer, may be provided, wherein solder bumps 171 may be formed so as to connect to the contact surface 154S. To this end, the material 170 may be applied and may be subsequently patterned by well-established process techniques for polyamide material, followed by the deposition of conductive materials, such as materials 171B, in order to provide appropriate interface characteristics with respect to a further material 171a, such as a lead-free solder material and the like. Consequently, if the processing of the device 100 for forming the polyamide material 170 and the bump structure 171 is performed in the remote manufacturing site, the deteriorated surface 154S (FIG. 1c) may result in significant yield loss unless significant reworking is performed, which, however, may require additional process tool resources which are typically not available in any such manufacturing sites. On the other hand, providing a dedicated terminal metal layer, such as aluminum, or forming the bump structure 171 in the same manufacturing facility in which the metallization system 150 is formed, may require additional resources, which is frequently not compatible with the existing equipment and configuration of semiconductor manufacturing facilities.

In view of the situation described above, the present disclosure relates to manufacturing strategies and semiconductor devices in which complex copper-based metallization systems may be formed up to a manufacturing stage in which the finalizing, i.e., the polyamide processing and the contact processing, may be performed in a remote manufacturing environment, while avoiding, or at least reducing, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally provides manufacturing techniques and semiconductor devices in which the passivation layer formed above the final or very last metallization layer may be appropriately patterned so as to avoid sophisticated plasma-based etch processes during the further processing, while at the same time the sensitive copper-containing contact surface of the contact regions in the last metallization layer may be passivated in order to allow transport and significant queue times, substantially without surface deterioration. Hence, the further processing may be continued at a remote manufacturing facility without requiring additional resources with respect to plasma-based etch processes. To this end, an appropriate protection layer may be incorporated so as to enable a reliable passivation of the sensitive copper-containing contact surface, while a removal of the protection layer may be accomplished without requiring sophisticated plasma-based etch strategies.

One illustrative method disclosed herein comprises forming a final metallization layer of a metallization system of a semiconductor device in a first manufacturing environment. The metallization system is formed above a substrate that comprises a plurality of die regions, wherein the final metallization layer comprises contact regions that have a copper-containing contact surface. The method further comprises forming a passivation layer stack above the final metallization layer and patterning the passivation layer stack so as to form an opening above a portion of the copper-containing contact surface of each of the contact regions. Moreover, the method comprises forming a protection layer on at least the portion of the copper-containing contact surface of each contact region prior to processing the semiconductor device in a second manufacturing environment that is remote from the first manufacturing environment.

A further illustrative method disclosed herein comprises forming a metallization system of a semiconductor device on the basis of copper in a manufacturing environment, wherein the metallization system comprises a final metallization layer that comprises a plurality of metal contact regions. The method further comprises forming a protection layer on the final metallization layer and forming a passivation layer stack above the protection layer. Additionally, the method comprises performing an etch process in the manufacturing environment so as to form an opening in the passivation layer stack above each of the plurality of metal contact regions without etching through the protection layer.

One illustrative semiconductor device disclosed herein comprises a plurality of die regions formed on a carrier material, wherein each of the die regions comprises a metallization system, which in turn comprises a final metallization layer having a copper-based metal region that includes a copper-containing contact surface. The semiconductor device further comprises forming a cap layer formed above the final metallization layer. Moreover, a passivation layer stack is formed above the cap layer and comprises an opening positioned above and aligned with a portion of the copper-containing contact surface. Additionally, the semiconductor device comprises a protection layer formed on the portion of the copper-containing contact surface.

BRIEF DESCRIPTION OF THE DRAWINGS

The disclosure may be understood by reference to the following description taken in conjunction with the accompanying drawings, in which like reference numerals identify like elements, and in which.

Figure 1A:
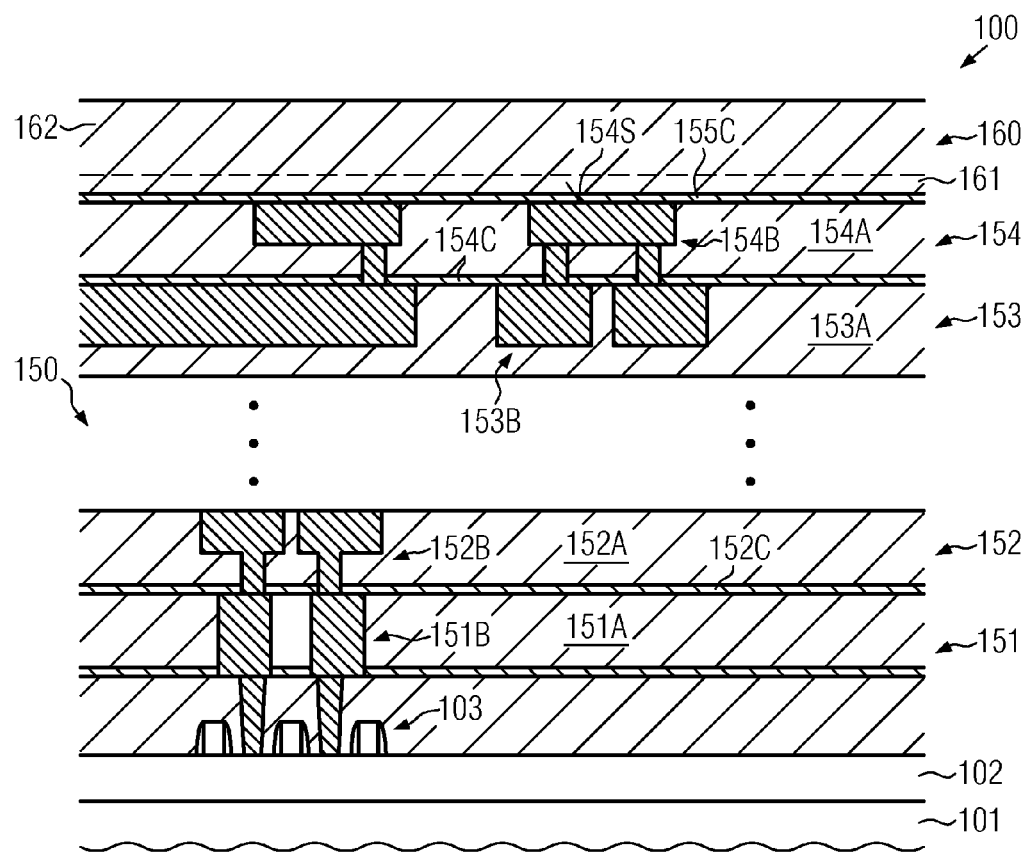
FIGS. 1a-1b schematically illustrate cross-sectional views of a semiconductor device during various manufacturing stages in forming a complex copper-based metallization system according to conventional strategies, wherein FIG. 1b also illustrates a top view of semiconductor substrates including a plurality of die regions processed in a specific manufacturing environment.
Figure 1B:
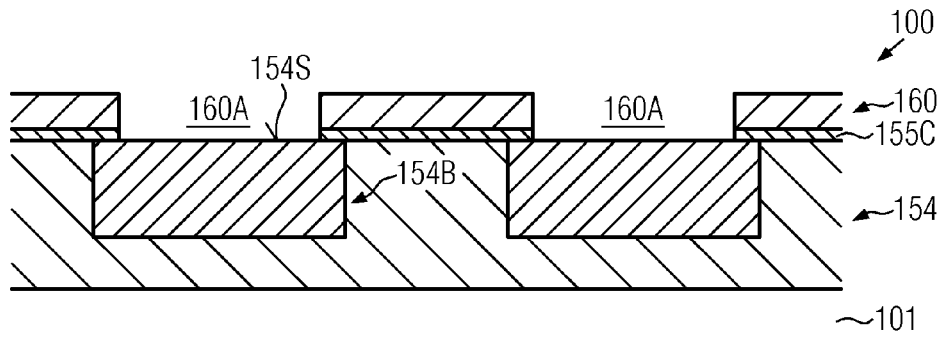
Figure 1B:
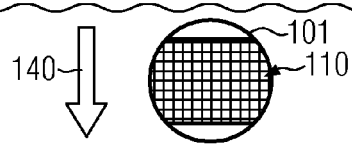
Figure 1C:
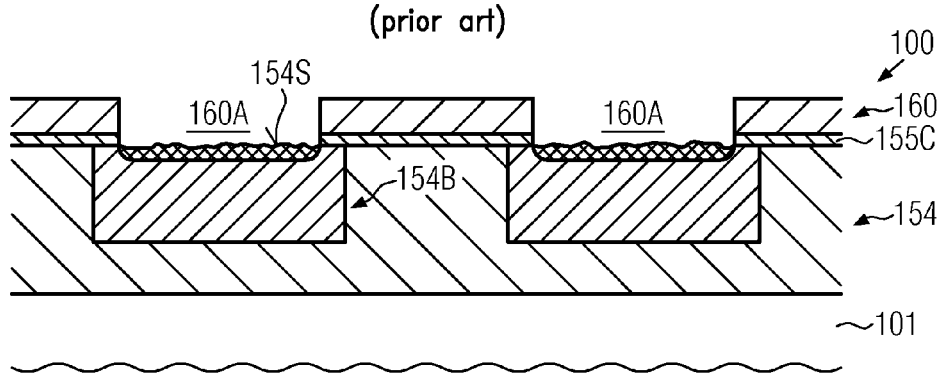
FIG. 1c schematically illustrates a cross-sectional view of the semiconductor device after transport to a remote manufacturing facility, according to conventional process strategies.
Figure 1D:
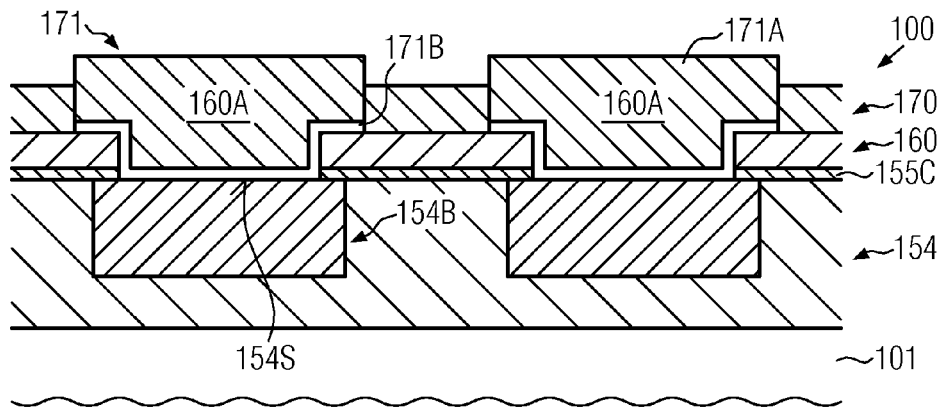
FIG. 1d schematically illustrates the semiconductor device in a further advanced manufacturing stage.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides manufacturing techniques and semiconductor devices in which basically a desired separation of manufacturing flows may be accomplished after forming a complex copper-based metallization system and a passivation layer stack on the one hand and the further processing including the provision of appropriate contact regimes including the dicing and packaging of the semiconductor substrates on the other hand. To this end, the patterning of the passivation layer stack may be accomplished within the same manufacturing environment, which is also used for forming the metallization system, wherein, however, in order to provide superior surface characteristics of a copper-containing contact surface, an additional protection layer may be implemented, which provides sufficient integrity of the sensitive contact surface, while at the same time enabling an efficient and fast removal at the remote manufacturing site without requiring plasma-based etch strategies. For example, in some illustrative embodiments, an appropriate protective material, such as a silicon and oxygen-containing dielectric material, for instance in the form of silicon oxynitride and the like, may be formed on the exposed contact surface, thereby ensuring integrity of the contact surface while enabling an efficient removal on the basis of wet chemical etch chemistries, for instance using hydrofluoric acid (HF) and the like. The protection layer may be incorporated at any appropriate manufacturing stage, for instance, in some illustrative embodiments, prior to forming a dielectric cap layer and depositing the passivation layer stack, wherein the protection layer may then be used as an efficient etch stop or etch control layer upon patterning the passivation layer stack and opening the dielectric cap layer. In other illustrative embodiments, the protection layer may be formed after the patterning of the passivation layer stack and the dielectric cap layer when exposing a portion of the sensitive contact surface so that the protection layer may be formed on any exposed surface areas, which may thus enable an efficient removal in the remote manufacturing site on the basis of wet chemical etch chemistry without unduly affecting any underlying dielectric materials, such as the material of the passivation layer stack and the like. In still other illustrative embodiments, the protection layer may be formed selectively on the exposed contact surface after the patterning of the passivation layer stack and of the dielectric cap layer. To this end, a uniform oxide layer, such as a copper oxide, may be provided, for instance, on the basis of an oxidation process, wherein, due to the uniform characteristics of the resulting oxide layer, an efficient and reliable removal in the remote manufacturing site may be accomplished on the basis of a non-masked wet chemical etch process.

With reference to FIGS. 2a-2f, further illustrative embodiments will now be described in more detail, wherein reference may also be made to FIGS. 1a-1d, if required.

Figure 2A:
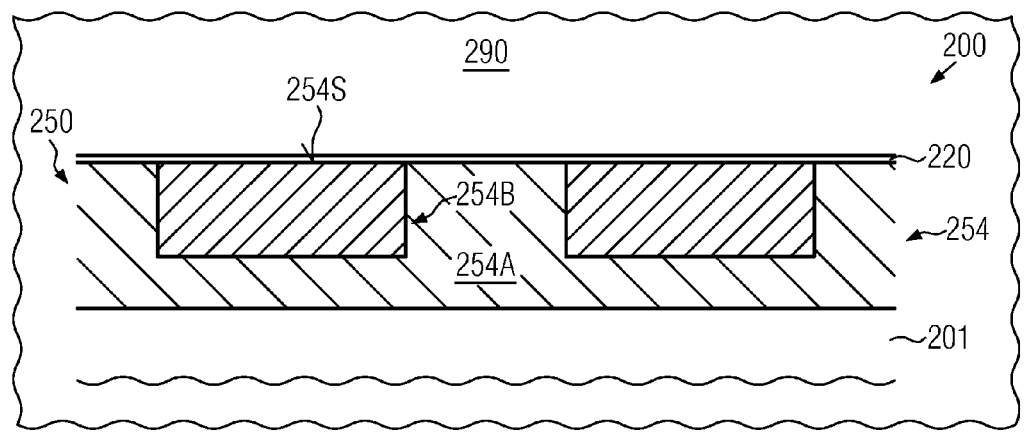
FIGS. 2a-2c schematically illustrate cross-sectional views of a semiconductor device during various manufacturing stages in forming a metallization system including a final metallization layer with copper-based contact regions and a passivation layer stack that may be patterned in the same manufacturing environment that is used for forming the metallization system, according to illustrative embodiments.

FIG. 2a schematically illustrates a cross-sectional view of a semiconductor device 200 in an advanced manufacturing stage. The device 200 may comprise any appropriate carrier material 201, such as a semiconductor material and the like, in and above which may be provided appropriate semiconductor materials in order to form semiconductor-based circuit elements, as is, for instance, also explained with reference to the device 100 in FIG. 1a. For convenience, any such circuit elements are not shown in FIG. 2a. Furthermore, the device 200 may comprise a metallization system 250, which typically comprises a plurality of metallization layers, as is, for instance, shown in FIG. 1a when referring to the metallization system 150 of the device 100. For convenience, any such metallization layers are not illustrated in FIG. 2a. Moreover, the metallization system 250 may comprise a final metallization layer 254, which may comprise appropriate contact regions 254B, which are appropriately positioned and may have an appropriate lateral size so as to enable the formation of an appropriate contact regime or to perform appropriate wire bond processes, as is also discussed above. It should be appreciated that the metallization system 250 may be formed on the basis of copper and, at least in some metallization layers, on the basis of a low-k dielectric material, as is also discussed above. Consequently, the metal regions 254B may comprise copper, possibly in combination with appropriate barrier materials, such as tantalum nitride, tantalum and the like, which, for convenience, are not shown in FIG. 2a. Thus, the regions 254B comprise a copper-containing contact surface 254S, at least a portion of which will be exposed in a later manufacturing stage so as to be compatible with the desired contact regime still to be formed. Moreover, in the embodiment shown, the device 200 may comprise a protection layer 220, which may be formed on a dielectric material 254A of the metallization layer 254 and on the contact surface 254S of each of the regions 254B. In some illustrative embodiments, the protection layer 220 may represent a silicon and oxygen-containing dielectric material, such as a silicon oxynitride, or any other appropriate dielectric material, which may be removed on the basis of wet chemical etch recipes in a reliable manner without causing significant material erosion in other dielectric materials and, in particular, within the contact regions 254B. For example, a plurality of materials may be efficiently removed on the basis of hydrofluoric acid, which may provide for fast removal rates of silicon oxide-based materials while not unduly affecting other dielectric materials, such as silicon nitride and the like, and in particular the region 254B may not be unduly affected by the wet chemical etch chemistry. The protection layer 220 may be provided with a thickness of approximately 10-50 nm, thereby providing sufficient etch stop capabilities during the further processes when patterning the passivation layer stack, while it should be appreciated that any other thickness values may be selected in accordance with the further processing.

The semiconductor device 200 as shown in FIG. 2a may be formed within a specific manufacturing environment 290 in order to form semiconductor-based circuit elements and a plurality of metallization layers, such as the metallization layers as previously described with reference to the semiconductor device 100. Moreover, at a final phase of the manufacturing process, the metallization layer 254 may be formed by depositing the dielectric material 254A and patterning the same in order to form appropriate openings, which may be subsequently filled by a barrier material in combination with a copper material, wherein any excess material may be removed by chemical mechanical polishing (CMP) and the like. Thereafter, the protection layer 220 may be deposited, for instance, by plasma enhanced chemical vapor deposition (CVD) and the like. It should be appreciated that the processing within the manufacturing environment 290 is performed on a "wafer basis," wherein a plurality of die regions are simultaneously processed, as, for instance, also described above with reference to the device 100 when referring to the plurality of die regions 110.

Figure 2B:
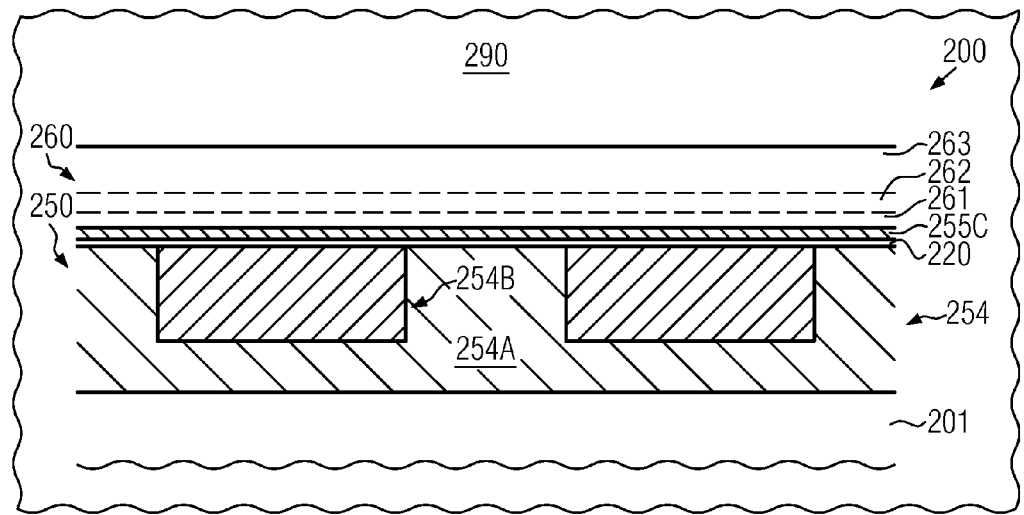

FIG. 2b schematically illustrates the device 200 in a further advanced manufacturing stage within the manufacturing environment 290. As shown, a dielectric cap layer 255C, such as a silicon nitride material, a nitrogen-enriched silicon carbide material and the like, may be formed above or, in some illustrative embodiments, on the protection layer 220 with any appropriate thickness so as to comply with the overall device requirements. Furthermore, a passivation layer stack 260 is formed on the cap layer 255C and may comprise one or more layers, such as layers 261, 262, 263, as required. For example, frequently, silicon nitride, silicon dioxide, silicon oxynitride may be provided. It should be appreciated that, in some illustrative embodiments, at least an outermost layer 263 may have a different material composition compared to the protection layer 220, if corresponding material erosion during the further processing may be considered inappropriate. In other cases, the thickness of the layer stack 260 may be selected such that specific material erosion upon removing a portion of the protection layer 220 in a later manufacturing stage may be taken into consideration. The layer 255C and the stack 260 may be formed on the basis of any appropriate and well-established process strategy.

Figure 2C:
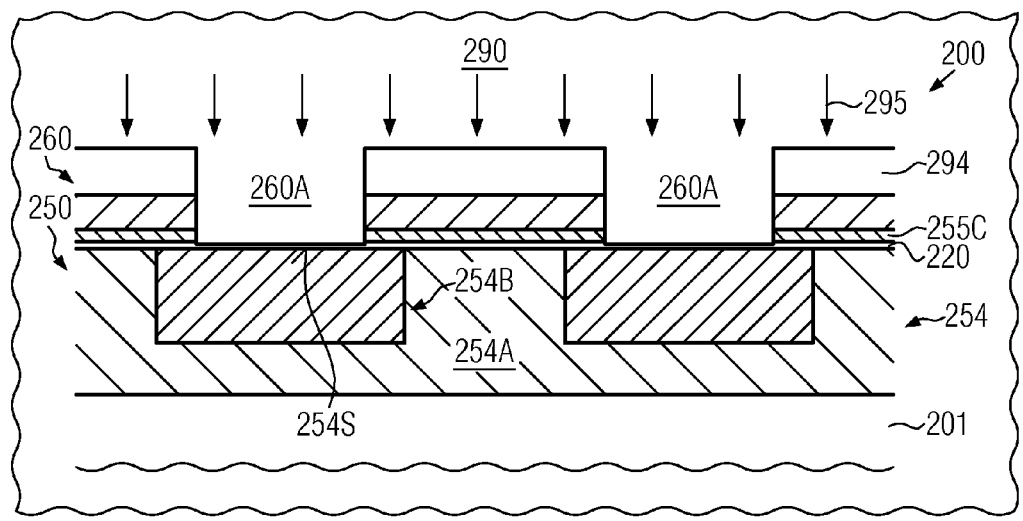

FIG. 2c schematically illustrates the device 200 in a further advanced manufacturing stage within the manufacturing environment 290. In this manufacturing stage, an etch process 295 may be applied on the basis of an appropriate etch mask 294, such as a resist mask, in order to form openings 260A in the passivation layer stack 260 and in the dielectric cap layer 255C. To this end, appropriate plasma-based etch recipes may be applied in order to etch through the stack 260, possibly using the layer 255C as an etch stop material, wherein subsequently a further etch step may be applied so as to etch through the layer 255C, while using the protection layer 220 as an etch stop material or as an etch control material. For example, a plurality of well-established plasma assisted etch recipes are available for etching through a silicon nitride-based material of the layer 255C with a high degree of selectivity with respect to a silicon oxide-based material, such as silicon dioxide, silicon oxynitride and the like. In this manner, the etch process 295 may be reliably stopped on or within the protection layer 220 without exposing the contact surface 254S. Hence, the sensitive surface areas 254S remain reliably covered by the protection layer 220. Consequently, after the etch process 295 and the removal of the etch mask 294, the device 200 is appropriately passivated with respect to any further transport activities and waiting times before continuing the processing by forming contact elements, such as bump structures, or preparing the device for wire bond process strategies and the like. Consequently, in some illustrative embodiments, as indicated by 240, the device 200 may be transported to a remote manufacturing environment.

Figure 2D:
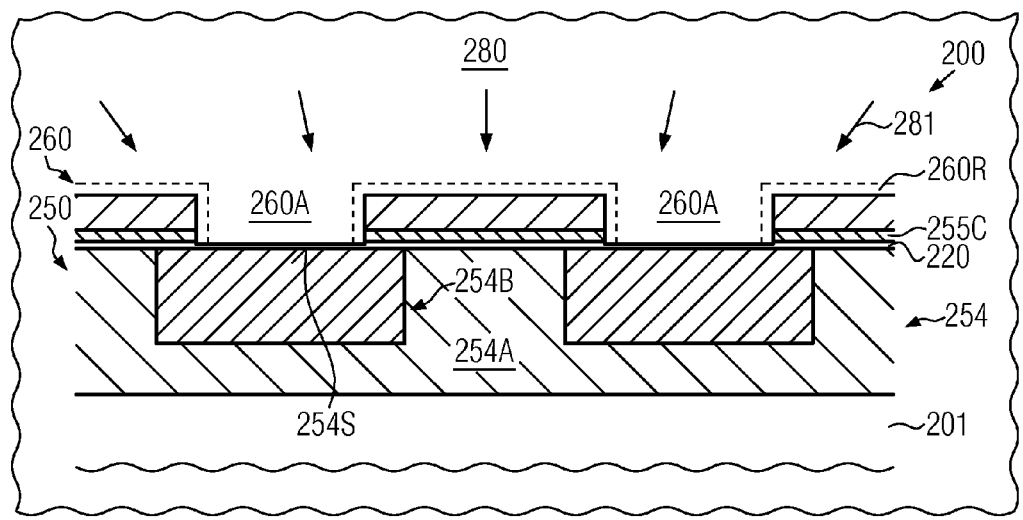
FIG. 2d schematically illustrates the device in a further advanced manufacturing stage wherein the device may be processed in a remote manufacturing facility on the basis of superior surface conditions of the copper-containing contact surface, according to illustrative embodiments.

FIG. 2d schematically illustrates the device 200 in a manufacturing environment 280, which may be appropriately equipped so as to enable the further processing of the device 200. In some illustrative embodiments, an etch process 281 may be performed within the environment 280 in order to remove any exposed portions of the protection layer 220, thereby re-exposing the contact surface areas 254S, or at least a portion thereof, as defined by the passivation layer stack 260. To this end, in some illustrative embodiments, the etch process 281 may be performed as a wet chemical etch process without requiring any plasma assisted process atmospheres. To this end, appropriate wet chemical etch chemistries, such as HF, may be applied in order to remove exposed portions of the protection layer 220 without unduly affecting the regions 254B. It should be appreciated that, due to the reduced thickness of the protection layer 220, a certain degree of erosion, as indicated by 260R, may not negatively affect the further processing and the finally obtained device characteristics, wherein, if required, any such material erosion may be readily taken into consideration upon selecting the initial thickness of the layer stack 260 and selecting a reduced initial thickness of the openings 260A. Consequently, the surface areas 254S may be exposed on the basis of a non-masked etch process, i.e., without requiring a dedicated patterned resist material, wherein a moderately high etch rate may result in an efficient overall process flow. On the basis of the exposed surface areas 254S, the further processing may be continued, for instance, by forming an appropriate bump structure, as, for instance, shown and explained with reference to FIG. 1d when referring to the semiconductor device 100. In this case, the corresponding dielectric material, for instance in the form of polyamide, may be provided and an appropriate process sequence may be applied for forming barrier materials and the bump material, which may be subsequently patterned on the basis of any well-established process strategy. In other cases, the surface areas 254S may represent bond areas for performing a wire bond process in a later manufacturing stage. In this case, the etch process 281 may be performed at any appropriate phase prior to the actual wire bond process, thereby ensuring integrity of the contact surface areas 254S and thus enabling a direct connection with a bond wire.

Figure 2E:
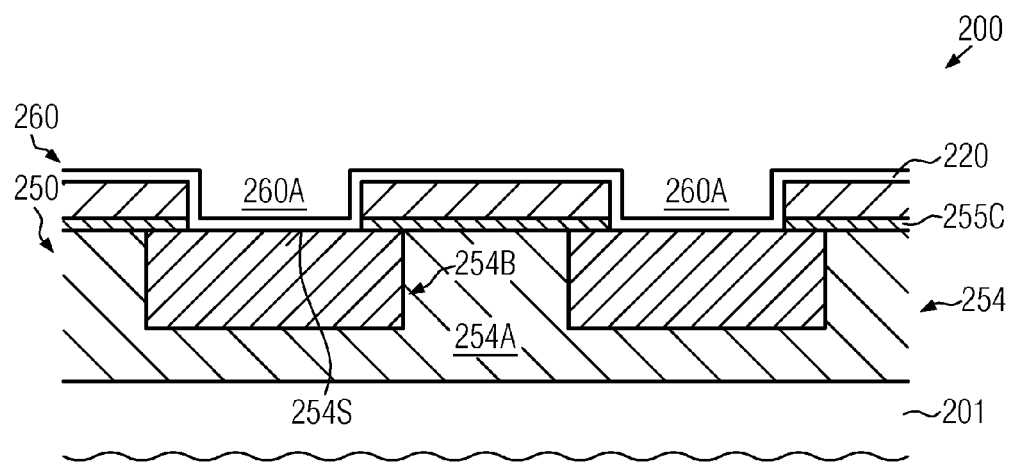
FIGS. 2e-2f schematically illustrate cross-sectional views when patterning a passivation layer stack and implementing an additional protection layer, according to further illustrative embodiments.

FIG. 2e schematically illustrates the semiconductor device 200 according to further illustrative embodiments. It should be appreciated that the device 200 may be processed in the manufacturing environment 290, as shown in FIGS. 2a-2c. As illustrated, the passivation layer stack 260 and the dielectric cap layer 255C, which may now be formed directly on the dielectric material 254A and the contact surface 254S, may be patterned so as to form the openings 260A, which may thus expose a portion of the contact surface 254S. In this manufacturing stage, the protection liner 220 may be deposited on the basis of any appropriate deposition technique, wherein also the material composition may be selected so as to allow a fast and efficient removal of the protection layer 220 on the basis of a wet chemical etch chemistry, as is discussed above. For example, silicon dioxide, silicon oxynitride, amorphous carbon and the like may be used as long as these materials ensure sufficient integrity of the surface 254S during any extended waiting times and transport activities. Consequently, in the state as shown in FIG. 2e, the device 200 may be transported to a manufacturing environment 280 (FIG. 2d) and the corresponding etch process may be applied, thereby efficiently removing the protection layer 220. In this case, undue exposure of the passivation layer stack 260 and the cap layer 255C may be avoided since these components may be exposed to the reactive etch ambient in a final phase only, i.e., in a certain over-etch period, which may allow reliably exposing the surface 254S. Thereafter, the further processing may be continued, as already discussed above.

Figure 2F:
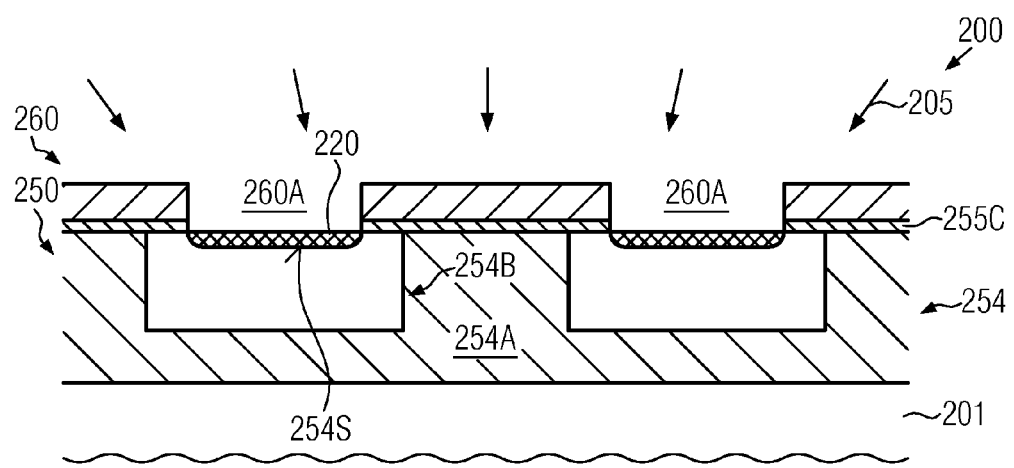

FIG. 2f schematically illustrates the semiconductor device 200 according to still further illustrative embodiments. As shown, the openings 260A may be provided in the passivation layer stack 260 and in the cap layer 255C, thereby initially exposing a portion of the surface 254S. Thereafter, the protection layer 220 may be formed in a highly selective manner, for instance by performing an electrochemical deposition process in order to form the layer 220 as a conductive cap material, which may have a desired high removal rate in a dedicated wet chemical etch chemistry. For example, a plurality of well-established conductive barrier materials, such as tantalum, titanium, binary or ternary alloys including tungsten, cobalt, phosphorous and the like, may be efficiently formed on the basis of electroless plating techniques. These materials may also be removed on the basis of an appropriate etch chemistry, which may also result in removal of any metal residues formed on the passivation layer stack 260. In other cases, the selective formation of the protection layer 220 may be accomplished on the basis of an oxidation process 205, in which the copper material may be oxidized on the basis of highly controllable process conditions, thereby forming the layer 220 with uniform and predictable and reproducible material characteristics in terms of layer thickness and material composition. In this manner, the actual contact surface 254S may thus be formed by the interface between the layer 220 and the remaining region 254B. The layer 220 may hence passivate the region 254B and may thus provide the required integrity of the region 254B upon transporting the device 200 to the remote manufacturing environment. Thereafter, an appropriate wet chemical etch process may be applied so as to efficiently remove the highly uniform protection layer 220 and the further processing may be continued, as described above.

As a result, the present disclosure provides manufacturing techniques and semiconductor devices in which a passivation layer stack may be patterned, however, without jeopardizing integrity of a copper-containing contact surface. To this end, an appropriate protection material is incorporated so as to cover at least a portion of the contact surface that has to be exposed during the further processing in a remote manufacturing site, which may be accomplished on the basis of an efficient wet chemical etch process without requiring plasma-assisted etch recipes and any lithography masks.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a final metallization layer of a metallization system of a semiconductor device in a first manufacturing environment, said metallization system being formed above a substrate comprising a plurality of die regions, said final metallization layer comprising contact regions having a copper-containing contact surface positioned in a layer of insulating material;
    forming a dielectric cap layer on and in contact with an upper surface of the layer of insulating material and on and in contact with the copper-containing contact surface, wherein the dielectric cap layer is comprised of silicon nitride or silicon carbide;
    forming a passivation layer stack above said final metallization layer and on and in contact with an upper surface of the dielectric cap layer;
    patterning said passivation layer stack and the dielectric cap layer so as to form an opening through the passivation layer stack and the dielectric cap layer and that exposes a portion of said copper-containing contact surface of each of said contact regions;
    performing a conformal deposition process to form a protection liner layer on said exposed portion of said copper-containing contact surface of each of said contact regions and on an upper surface of the patterned passivation layer stack an on the patterned dielectric cap layer prior to processing said semiconductor device in a second manufacturing environment that is remote from said first manufacturing environment; and
    removing said protection liner layer at least from above said previously exposed portion of said copper-containing contact surface in said second manufacturing environment by performing a wet chemical etch process, wherein said wet chemical etch process is performed in the absence of a photoresist etch mask.

2. The method of claim 1, wherein forming said protection liner layer comprises forming a silicon and oxygen containing material liner layer.

3. The method of claim 1, wherein said wet chemical etch process is performed on the basis of hydrofluoric acid (HF).

4. A method, comprising:
    forming a metallization system of a semiconductor device comprised of copper in a manufacturing environment, said metallization system comprising a final metallization layer comprising a plurality of metal contact regions positioned in a layer of insulating material;
    forming a dielectric cap layer on and in contact with an upper surface of the layer of insulating material and on and in contact with the metal contact regions, wherein the dielectric cap layer is comprised of silicon nitride or silicon carbide;

forming a passivation layer stack on and in contact with an upper surface of the dielectric cap layer;

patterning said passivation layer stack and the dielectric cap layer so as to form an opening through the passivation layer stack and the dielectric cap layer that exposes a portion of said copper-containing contact surface of each of said contact regions;

performing a conformal deposition process to form a protection liner layer comprised of silicon dioxide on said exposed portion of said metal contact regions and on an upper surface of the patterned passivation layer stack an on the patterned dielectric cap layer prior to processing said semiconductor device in a second manufacturing environment that is remote from said first manufacturing environment; and transporting said semiconductor device to the second manufacturing environment and removing the first protection liner layer at least from above said previously exposed portion of the metal contact regions by performing a wet chemical etch process, wherein said wet chemical etch process is performed in the absence of a photoresist etch mask.

5. The method of claim 4, wherein said wet chemical etch process is performed on the basis of hydrofluoric acid (HF).

6. A method, comprising:

forming a final metallization layer of a metallization system of a semiconductor device in a first manufacturing environment, said metallization system being formed above a substrate comprising a plurality of die regions, said final metallization layer comprising contact regions having a copper-containing contact surface positioned in a layer of insulating material;

forming a dielectric cap layer on and in contact with an upper surface of the layer of insulating material and on and in contact with the copper-containing contact surface, wherein the dielectric cap layer is comprised of silicon nitride or silicon carbide;

forming a passivation layer stack above said final metallization layer and on and in contact with an upper surface of the dielectric cap layer;

patterning said passivation layer stack and the dielectric cap layer so as to form an opening through the passivation layer stack and the dielectric cap layer and that exposes a portion of said copper-containing contact surface of each of said contact regions; and performing a conformal deposition process to form a protection liner layer on said exposed portion of said copper-containing contact surface of each of said contact regions and on an upper surface of the patterned passivation layer stack an on the patterned dielectric cap layer prior to processing said semiconductor device in a second manufacturing environment that is remote from said first manufacturing environment, wherein said protection liner layer comprises a silicon and oxygen containing material.

* * * * *